United States Patent
Alahyari et al.

(10) Patent No.: US 11,498,686 B2
(45) Date of Patent: Nov. 15, 2022

(54) REFRIGERATION SYSTEMS

(71) Applicant: Hamilton Sundstrand Corporation, Charlotte, NC (US)

(72) Inventors: Abbas A. Alahyari, Glastonbury, CT (US); Abdelrahman I. Elsherbini, Windsor, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 306 days.

(21) Appl. No.: 16/562,868

(22) Filed: Sep. 6, 2019

(65) Prior Publication Data
US 2021/0070452 A1    Mar. 11, 2021

(51) Int. Cl.
     *B64D 13/06*      (2006.01)
     *F25B 1/08*      (2006.01)

(52) U.S. Cl.
CPC .............. *B64D 13/06* (2013.01); *F25B 1/08* (2013.01); *B64D 2013/0614* (2013.01)

(58) Field of Classification Search
CPC .... B64D 13/06; B64D 2013/0614; F25B 1/08
See application file for complete search history.

(56) References Cited

U.S. PATENT DOCUMENTS 3,757,530 A * 9/1973 Doyle ................ H05K 7/20381
                                                         62/117
4,905,481 A * 3/1990 Scaringe ................ C09K 5/044
                                                         62/500

(Continued)

FOREIGN PATENT DOCUMENTS

EP      0354037 A2     2/1990
EP      3339176 A1 * 6/2018 ............. B64D 13/06

(Continued)

OTHER PUBLICATIONS

Omar Baagil and Vladimir Mahalec":Ejector Refrigeration Cycle for Natural Gas Plant Waste Heat Recovery in Hot Climates",AICHE Spring National Meeting, Apr. 29, 2015 (Apr. 29, 2015), pp. 271-282, XP009195001.

(Continued)

*Primary Examiner* — Joseph F Trpisovsky
(74) *Attorney, Agent, or Firm* — Locke Lord LLP; Daniel J. Fiorello; Gabrielle Gelozin

(57) ABSTRACT

A refrigeration system can include a main flow circuit configured to flow a refrigerant therethrough and a heat input disposed in the main flow circuit and configured to receive heat and transfer the heat to the refrigerant in the main flow circuit to output heated refrigerant flow. The system can include a passive pump disposed in the main flow circuit downstream of the heat input configured to receive the heated refrigerant flow from the heat input and to use the heated refrigerant flow to generate a vacuum at a pump port and a condenser disposed in the main flow circuit downstream of the passive pump for receiving flow from the passive pump. The condenser can be configured to receive heat from the heated refrigerant flow and reject heat to cool the heated refrigerant flow to output partially cooled refrigerant flow. An outlet of the condenser can be upstream of the heat input.

12 Claims, 3 Drawing Sheets

(56) References Cited

U.S. PATENT DOCUMENTS

| | | | | |
|---|---|---|---|---|
| 5,239,837 A | * | 8/1993 | Kowalski | F25B 1/08 |
| | | | | 62/238.6 |
| 2008/0087406 A1 | * | 4/2008 | Asfia | F28D 15/0233 |
| | | | | 165/104.29 |
| 2011/0289953 A1 | * | 12/2011 | Alston | B60H 1/32 |
| | | | | 62/238.6 |
| 2018/0170554 A1 | | 6/2018 | Elsherbini et al. | |
| 2019/0118618 A1 | | 4/2019 | Elsherbini et al. | |

FOREIGN PATENT DOCUMENTS

| | | |
|---|---|---|
| EP | 3339176 A1 | 6/2018 |
| GB | 2418980 | 4/2006 |
| GB | 2418980 A | 4/2006 |

OTHER PUBLICATIONS

Extended European search report issued in corresponding EP application No. 19216128.9, dated Jul. 22, 2020.

\* cited by examiner

REFRIGERATION SYSTEMS

FIELD

This disclosure relates to refrigeration systems, e.g., for cooling aircraft electronics.

BACKGROUND

In electronics cooling applications, for example, there is often an abundance of higher temperature heat sources while many components have a lower temperature tolerance. This is particularly typical in a "loss-of-cooling" scenario where cooling air is not available to electronics boxes for one reason or another or is too hot to provide sufficient or desired cooling.

Such conventional methods and systems have generally been considered satisfactory for their intended purpose. However, there is still a need in the art for improved refrigeration systems. The present disclosure provides a solution for this need.

SUMMARY

A refrigeration system can include a main flow circuit configured to flow a refrigerant therethrough and a heat input disposed in the main flow circuit and configured to receive heat and transfer the heat to the refrigerant in the main flow circuit to output heated refrigerant flow. The system can include a passive pump disposed in the main flow circuit downstream of the heat input configured to receive the heated refrigerant flow from the heat input and to use the heated refrigerant flow to generate a vacuum at a pump port and a condenser disposed in the main flow circuit downstream of the passive pump for receiving flow from the passive pump. The condenser can be configured to receive heat from the heated refrigerant flow and reject heat to cool the heated refrigerant flow to output partially cooled refrigerant flow. An outlet of the condenser can be upstream of the heat input.

The system can include a cooling branch having a cooling branch inlet in fluid communication with the main flow circuit and disposed downstream of the condenser, and a cooling branch outlet in fluid communication with the passive pump port to generate flow through the cooling branch with heated refrigerant flow through the passive pump. The system can include one or more cooling modules disposed in the cooling branch downstream of the cooling branch inlet and upstream of a cooling branch outlet, the one or more cooling modules configured to provide cooling to the one or more heat sources.

The system can include a non-passive pump (e.g., a pump that is not a compressor) disposed in the main flow circuit downstream of the condenser and configured add to and/or generate flow in one direction within the main flow circuit. The pump can also be downstream of the cooling branch inlet, in certain embodiments.

At least one expander can be disposed in the cooling branch between the cooling branch inlet and the one or more cooling modules. The expander can be configured to receive the partially cooled refrigerant flow and cause expansion cooling to output cooling flow to the one or more cooling modules.

The one or more cooling modules include a plurality of cooling modules (e.g., four) disposed downstream of the at least one expander. The plurality of cooling modules can be disposed in parallel with each other such that all cooling modules are connected to the cooling branch inlet directly and all cooling modules are connected to the cooling branch outlet directly.

The one or more cooling modules can include a wafer heat exchanger comprising a flat shape having a tortuous, planar refrigerant flow path defined therein. Each wafer heat exchanger can include an adhesive surface configured to stick to the heat source, for example. Any other suitable heat exchanger or other cooling structure is contemplated herein. The one or more cooling modules can be in thermal communication with one or more aircraft electronics, for example.

The heat input can include a heat exchanger in thermal communication with a waste heat source of an aircraft system. Any other suitable structure for the heat input is contemplated herein.

In accordance with at least one aspect of this disclosure, an aircraft electronics system can include one or more avionics electrical circuits. The aircraft electronics system can also include a refrigeration system as disclosed herein, e.g., as described above, operatively connected to the one or more avionics electrical circuits. For example, the one or more cooling modules can be disposed in thermal communication with the one or more aircraft avionics electrical circuits and can be configured to provide cooling to the one or more aircraft avionics electrical circuits. In certain embodiments, a wafer heat exchanger can include an adhesive surface configured to stick to the one or more aircraft avionics electrical circuits.

In accordance with at least one aspect of this disclosure, a method can include cooling a heat source using waste heat from an aircraft system and without using a compressor. Using waste heat can include using the waste heat to drive an ejector pump to generate flow through a cooling branch to provide cooling flow to one or more cooling modules in thermal communication with the heat source.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
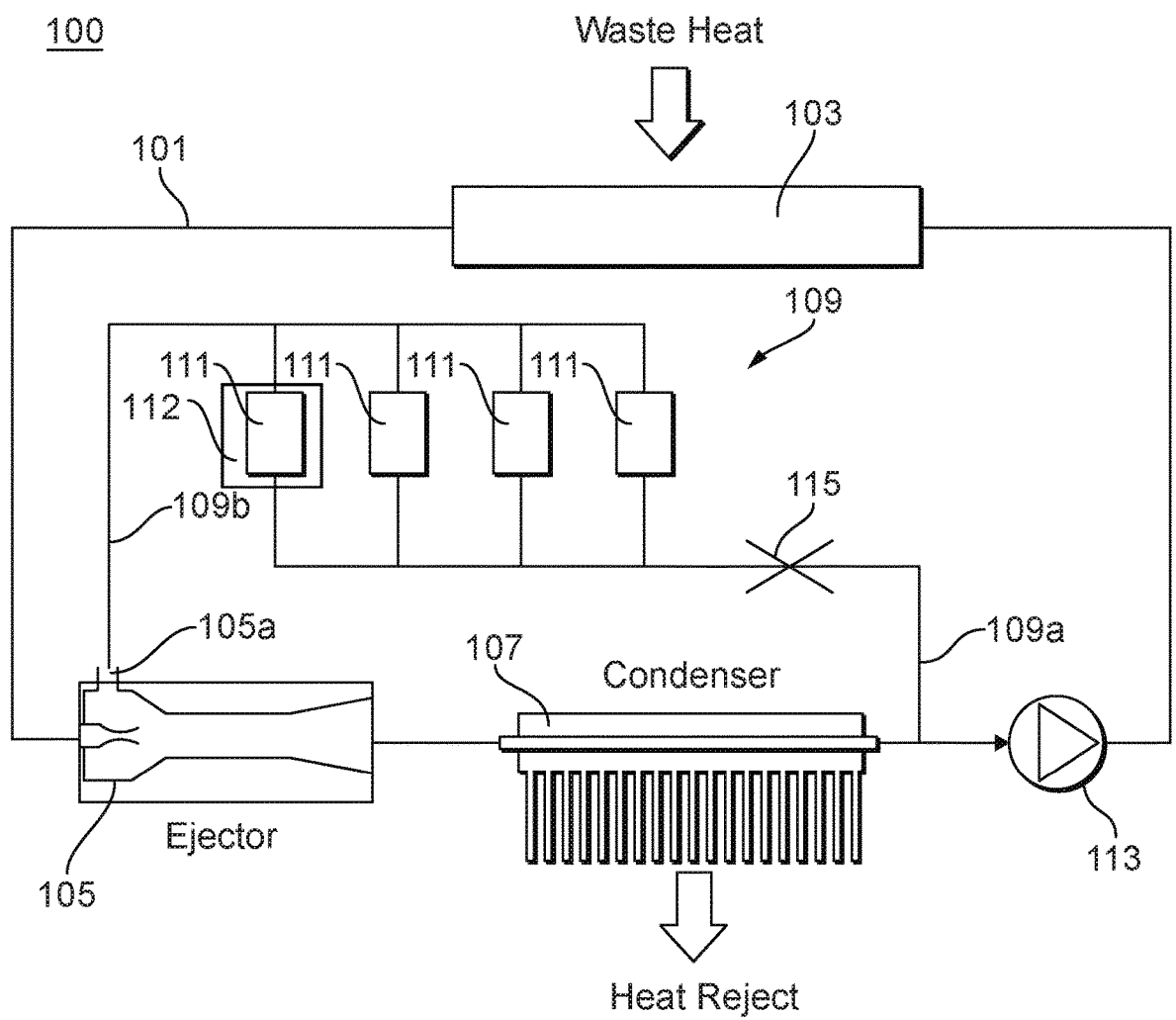
FIG. 1 is a schematic view of an embodiment of a refrigeration system in accordance with this disclosure.
Figure 2:
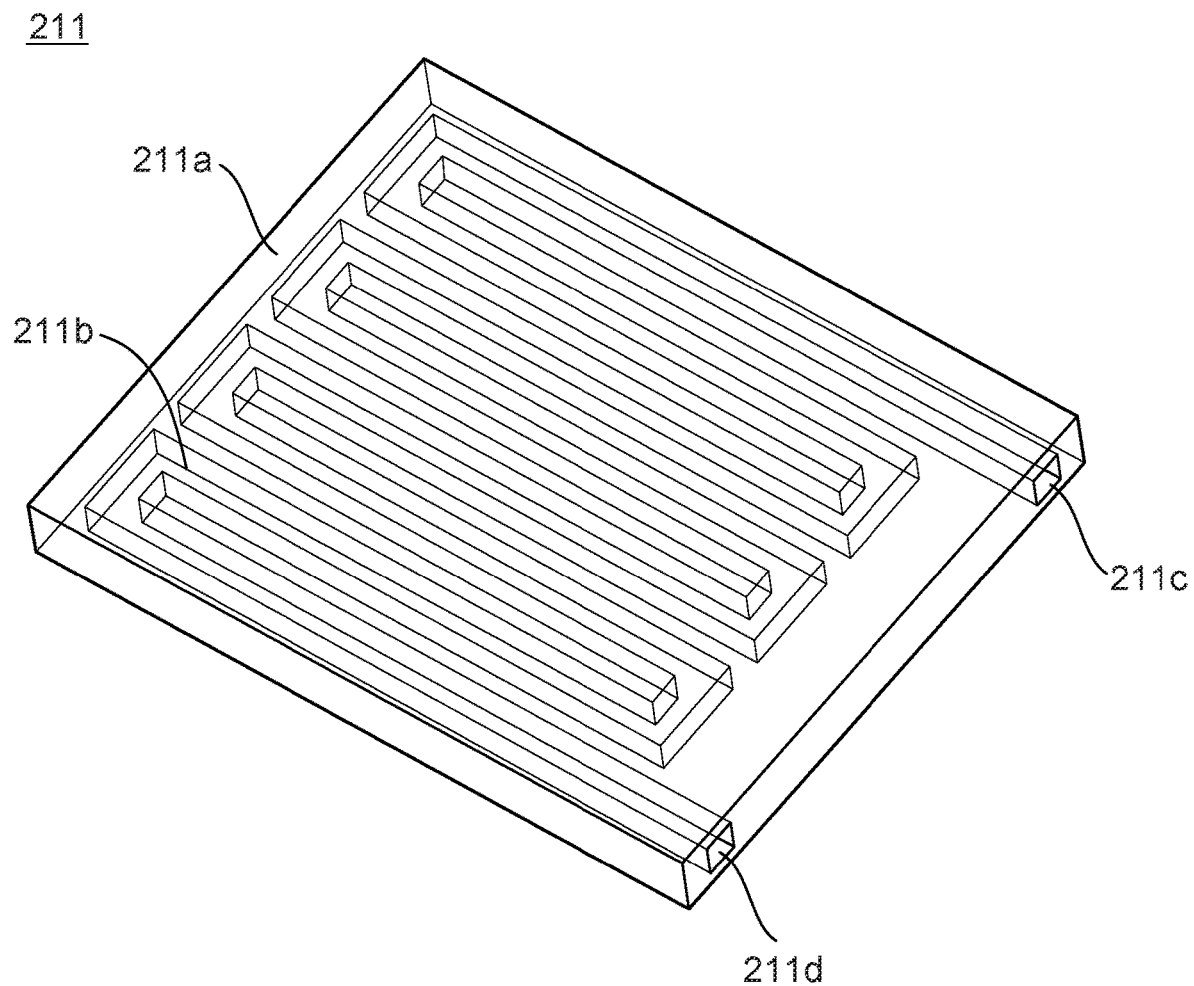
FIG. 2 is a plan view of an embodiment of a cooling module in accordance with this disclosure.
Figure 3:
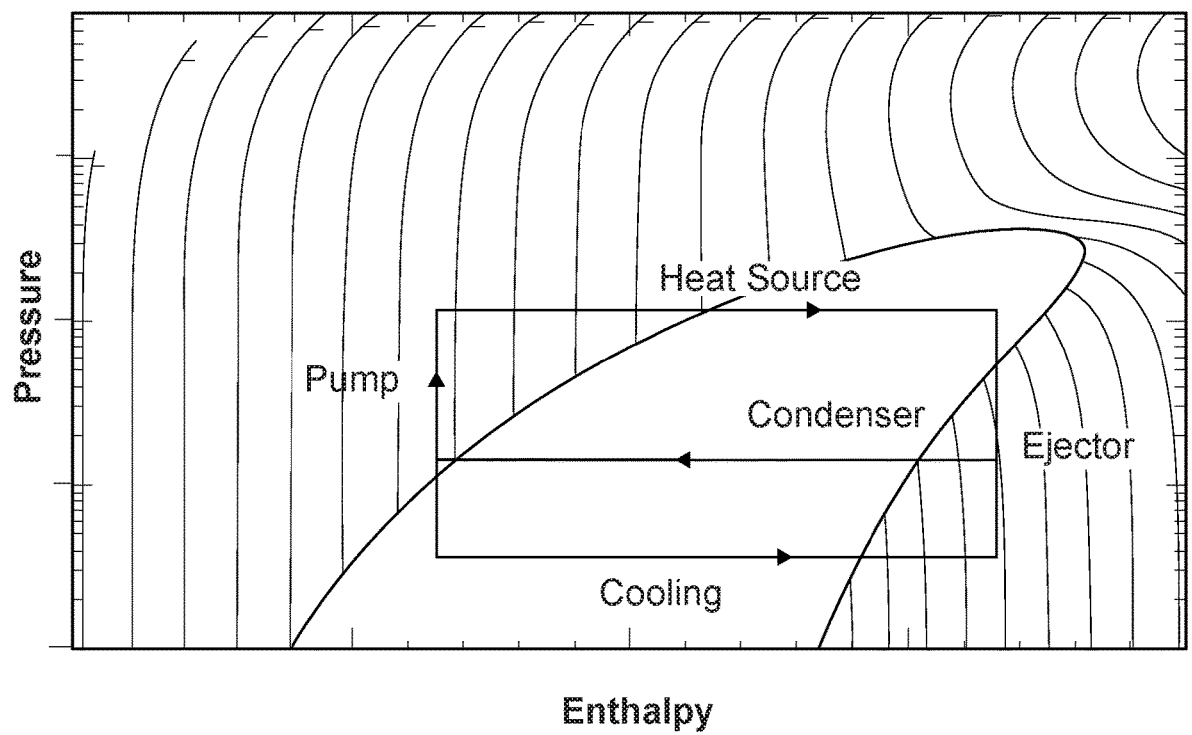
FIG. 3 is a pressure (temperature) vs. enthalpy diagram for the embodiment of FIG. 1 in accordance with this disclosure.

Reference will now be made to the drawings wherein like reference numerals identify similar structural features or aspects of the subject disclosure. For purposes of explanation and illustration, and not limitation, an illustrative view of an embodiment of a refrigeration system in accordance with the disclosure is shown in FIG. 1 and is designated generally by reference character 100. Other embodiments and/or aspects of this disclosure are shown in FIGS. 2 and 3. Certain embodiments described herein can be used to provide additional cooling over what can be provided by the ambient flow without a compressor and using only waste heat, for example.

A refrigeration system 100 can include a main flow circuit 101 configured to flow a refrigerant therethrough and a heat input 103 disposed in the main flow circuit 101 and configured to receive heat (e.g., waste heat) and transfer the heat to the refrigerant in the main flow circuit 101 to output heated refrigerant flow. The source of the heat for the heat input 103 can be any suitable source (e.g., waste heat from a turbomachine) and at any suitable temperature (e.g., about 150 degrees C. or higher). The main flow circuit 101 can include any suitable piping (e.g., constant diameter or otherwise) therein between any suitable components therein (e.g., direct pipe connections between each component in the main flow circuit 101).

The system 100 can include a passive pump 105 disposed in the main flow circuit 101 downstream of the heat input 103 configured to receive the heated refrigerant flow from the heat input 103 and to use the heated refrigerant flow to generate a vacuum (e.g., a pump pressure) at a pump port 105a. The passive pump 105 can be an ejector pump, for example. As appreciated by those having ordinary skill in the art, and ejector pump can provide a pressure drop due to flow ejected into the ejector pump. For example, the passive pump 105 can be a venture pump.

The system 100 can include a condenser 107 disposed in the main flow circuit 101 downstream of the passive pump 105 for receiving flow from the passive pump 105. The condenser 107 can be configured to receive heat from the heated refrigerant flow and reject heat (e.g., to the atmosphere) to cool the heated refrigerant flow to output partially cooled refrigerant flow. An outlet 107a of the condenser 107 can be upstream of the heat input 103, e.g., as shown.

The system 100 can include a cooling branch 109 having a cooling branch inlet 109a in fluid communication with the main flow circuit 101 and disposed downstream of the condenser 107, and a cooling branch outlet 109b in fluid communication with the passive pump port 105a to generate flow through the cooling branch 109 with heated refrigerant flow through the passive pump 105. The system 100 can include one or more cooling modules 111 disposed in the cooling branch 109 downstream of the cooling branch inlet 109a and upstream of a cooling branch outlet 109b. The one or more cooling modules 111 configured to provide cooling to the one or more heat sources 112 (e.g., one or more aircraft avionics electrical circuits).

The system 100 can include a non-passive pump 113 (e.g., a pump that is not a compressor) disposed in the main flow circuit 101 downstream of the condenser 107 and configured add to and/or generate flow in one direction within the main flow circuit 101. The non-passive pump 113 can also be downstream of the cooling branch inlet 109a, e.g., as shown, in certain embodiments. In certain embodiments, the non-passive pump 113 can be upstream of the cooling branch inlet 109a, although it may be beneficial to not allow heat added to the refrigerant from the non-passive pump 113 to flow to the one or more cooling modules 111. Embodiments may not include a compressor, and the term pump as used herein does not include compressors.

The system 100 can include at least one expander 115 can be disposed in the cooling branch 109 between the cooling branch inlet 109a and the one or more cooling modules 111. The expander 115 can be configured to receive the partially cooled refrigerant flow and cause expansion cooling to output cooling flow to the one or more cooling modules 111.

In certain embodiments, the expander 115 can be an expansion valve and/or an expansion orifice which causes cooling by expansion of the partially cooled refrigerant (e.g., in liquid or two phase when entering the expander 115).

As shown, the one or more cooling modules 111 include a plurality of cooling modules 111 (e.g., four as shown) disposed downstream of the at least one expander 115. The plurality of cooling modules 111 can be disposed in parallel, e.g., as shown, with each other such that all cooling modules 111 are connected to the cooling branch inlet directly 109b (e.g., through the expander 115) and all cooling modules 111 are connected to the cooling branch outlet 109b directly. Any other suitable arrangement (e.g., series, a combination of series and parallel) is contemplated herein.

Referring additionally to FIG. 2, the one or more cooling modules 111 can include a wafer heat exchanger 211 comprising a flat shape 211a having a tortuous (e.g., serpentine), planar refrigerant flow path 211b defined therein (e.g., defined between inlet 211c and outlet 211d). Each wafer heat exchanger 211 can include an adhesive surface configured to stick to the heat source 112, for example. Any suitable adhesive is contemplated herein. Any other suitable heat exchanger or other cooling structure is contemplated herein. The one or more cooling modules 111 can be in thermal communication with one or more aircraft electronics, for example.

The heat input 103 can include a heat exchanger (e.g., having fins, internal channels, and/or any other suitable structure) and can be in thermal communication with a waste heat source of an aircraft system (e.g., a turbomachine system or component), for example. Any other suitable structure for the heat input 103 (e.g., a section of pipe exposed to a waste heat source) is contemplated herein. Any other suitable heat source is contemplated herein. Any suitable refrigerant is contemplated herein (e.g., R1233zd, R245fa, R134a, R1234ze, R1234yf, R123, typical hydrocarbons, for example).

In order to produce heat rejection in the condenser 107, the waste heat temperature should be at a temperature higher than the ambient temperature used to cool the condenser 115. In certain systems and/or operational conditions, both the waste heat temperature and the ambient temperature can be higher than what is required to cool the heat source 112 (e.g., electrical circuitry). For example, in certain embodiments, the waste heat temperature can be above about 150 degrees C., while the ambient temperature around the condenser can be about 100 degrees C. In certain embodiments, the heat source can require cooling to about 50 degrees C. or below, for example, in which case cooling with the ambient air is not sufficient. In such a case, embodiments can provide a refrigeration cycle using the energy from the higher heat supply (e.g., waste heat) to produce cooling in one or more cooling modules (e.g., one or more evaporators) to cool the heat source (e.g., aircraft electronics) to a desired temperature (e.g., at or below about 50 degrees C.).

FIG. 3 is shows a pressure (which correlates to temperature) vs. enthalpy diagram for the embodiment disclosed above. The portion in FIG. 3 without lines through it is the two phase region, the right side is gas phase, and the left side is liquid phase.

In accordance with at least one aspect of this disclosure, an aircraft electronics system can include one or more avionics electrical circuits (not shown). The aircraft electronics system can also include a refrigeration system as disclosed herein, e.g., system 100 as described above, operatively connected to the one or more avionics electrical circuits. For example, the one or more cooling modules 111 can be disposed in thermal communication with (e.g., physically attached to) the one or more aircraft avionics electrical circuits and can be configured to provide cooling to the one or more aircraft avionics electrical circuits. In certain embodiments, a wafer heat exchanger, e.g., 211, can include an adhesive surface configured to stick to the one or more aircraft avionics electrical circuits.

In accordance with at least one aspect of this disclosure, a method can include cooling a heat source using waste heat from an aircraft system and without using a compressor. Using waste heat can include using the waste heat to drive an ejector pump to generate flow through a cooling branch to provide cooling flow to one or more cooling modules in thermal communication with the heat source.

As disclosed above, an ejector can be used to raise the pressure in a cooling branch to pull a refrigerant stream through one or more expanders (e.g., an expansion valve or orifice) and then through one or more cooling modules (e.g., one or more evaporators) to cool a heat source. Using waste heat and the passive pump removes a need for a compressor, can employ only a small pump to move flow in one direction which consumes much less energy and a compressor.

Embodiments can include cooling module that are very small, flat, and/or thin (e.g., about 2 mm thick), with a serpentine passage inside that can be applied with an adhesive. Embodiments can have two phase flow at the entrance of the cooling modules and all gas at outlet due to heat addition. Embodiments can include a single expander for all cooling modules or any other suitable number. For example, each cooling module can be connected to its own independent expander, and each expander can be controlled to control a cooling of each cooling module (e.g., differently than the other cooling modules).

Certain embodiments include a low-pressure refrigerant loop using a suitable refrigerant. Embodiments use a pump and available waste heat to generate a high energy motive stream. The motive stream can drives a lower pressure/temperature stream through an ejector. The output of the ejector which can be at an intermediate temperature/pressure can reject heat to ambient through an, e.g., air-cooled heat exchanger. The ejector, pump, and air-cooled heat exchanger may be integrated into a single compact component, for example. The cooling stream may be split into multiple heat transfer units that can be attached to components requiring cooling. These may be small stick-on modules, for example.

Embodiments can leverage the excess heat to provide local cooling at a lower temperature than ambient that can be applied to components that need it. Embodiments provide a simple, flexible cooling system providing local cooling using a higher temperature source that does not have a compressor and can include a higher efficiency than a typical vapor cycle.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A refrigeration system, comprising:
   a main flow circuit configured to flow a refrigerant therethrough;
   a heat input disposed in the main flow circuit and configured to receive heat and transfer the heat to the refrigerant in the main flow circuit to output heated refrigerant flow;
   a passive pump disposed in the main flow circuit downstream of the heat input configured to receive the heated refrigerant flow from the heat input and to use the heated refrigerant flow to generate a vacuum at a pump port,
   a condenser disposed in the main flow circuit downstream of the passive pump for receiving flow from the passive pump, the condenser configured to receive heat from the heated refrigerant flow and reject heat to cool the heated refrigerant flow to output partially cooled refrigerant flow, wherein an outlet of the condenser is upstream of the heat input;
   a cooling branch having a cooling branch inlet in fluid communication with the main flow circuit and disposed downstream of the condenser, and a cooling branch outlet in fluid communication with the passive pump port to generate flow through the cooling branch with heated refrigerant flow through the passive pump;

one or more cooling modules disposed in the cooling branch downstream of the cooling branch inlet and upstream of the cooling branch outlet, the one or more cooling modules configured to provide cooling to a heat source;

at least one expander disposed in the cooling branch between the cooling branch inlet and the one or more cooling modules, the expander configured to receive the partially cooled refrigerant flow and cause expansion cooling to output cooling flow to the one or more cooling modules, wherein the one or more cooling modules includes a plurality of cooling modules disposed downstream of the at least one expander, wherein the plurality of cooling modules are disposed in parallel with each other such that all cooling modules are connected to the cooling branch inlet directly and all cooling modules are connected to the cooling branch outlet directly, wherein the heat input includes a heat exchanger in thermal communication with a waste heat source of an aircraft system, and wherein the plurality of cooling modules are in thermal communication with one or more aircraft electronics.

2. The system of claim 1, further comprising a non-passive pump disposed in the main flow circuit downstream of the condenser and configured to add and/or generate flow in one direction within the main flow circuit.

3. The system of claim 2, wherein the non-passive pump is also downstream of the cooling branch inlet.

4. The system of claim 1, wherein the plurality of cooling modules include a wafer heat exchanger comprising a flat shape having a tortuous, planar refrigerant flow path defined therein.

5. The system of claim 4, wherein the wafer heat exchanger includes an adhesive surface configured to stick to the heat source.

6. The system of claim 1, wherein one or more of the plurality of cooling modules are in thermal communication with one or more respective aircraft electronics circuits to provide cooling to one or more aircraft avionics electrical circuits.

7. An aircraft electronics system, comprising:
one or more avionics electrical circuits; and
a refrigeration system operatively connected to the one or more avionics electrical circuits, comprising:
   a main flow circuit configured to flow a refrigerant therethrough;
   a heat input disposed in the main flow circuit and configured to receive heat and transfer the heat to the refrigerant in the main flow circuit to output heated refrigerant flow;
   a passive pump disposed in the main flow circuit downstream of the heat input configured to receive the heated refrigerant flow from the heat input and to use the heated refrigerant flow to generate a vacuum at a pump port,
   a condenser disposed in the main flow circuit downstream of the passive pump for receiving flow from the passive pump, the condenser configured to receive heat from the heated refrigerant flow and reject heat to cool the heated refrigerant flow to output partially cooled refrigerant flow, wherein an outlet of the condenser is upstream of the heat input;
   a cooling branch having a cooling branch inlet in fluid communication with the main flow circuit and disposed downstream of the condenser, and a cooling branch outlet in fluid communication with the passive pump port to generate flow through the cooling branch with heated refrigerant flow through the passive pump;
   one or more cooling modules disposed in the cooling branch downstream of the cooling branch inlet and upstream of a cooling branch outlet, the one or more cooling modules in thermal communication with the one or more aircraft avionics electrical circuits and configured to provide cooling to the one or more aircraft avionics electrical circuits; and
   at least one expander disposed in the cooling branch between the cooling branch inlet and the one or more cooling modules, the expander configured to receive the partially cooled refrigerant flow and cause expansion cooling to output cooling flow to the one or more cooling modules, wherein the one or more cooling modules includes a plurality of cooling modules disposed downstream of the at least one expander, wherein the plurality of cooling modules are disposed in parallel with each other such that all cooling modules are connected to the cooling branch inlet directly and all cooling modules are connected to the cooling branch outlet directly, wherein the heat input includes a heat exchanger in thermal communication with a waste heat source of an aircraft system and wherein the plurality of cooling modules are in thermal communication with one or more aircraft electronics.

8. The system of claim 7, wherein the refrigeration system further comprises a non-passive pump disposed in the main flow circuit downstream of the condenser and configured to add and/or generate flow in one direction within the main flow circuit.

9. The system of claim 8, wherein the non-passive pump is also downstream of the cooling branch inlet.

10. The system of claim 7, wherein the plurality of cooling modules include a wafer heat exchanger comprising a flat shape having a tortuous, planar refrigerant flow path defined therein.

11. The system of claim 10, wherein the wafer heat exchanger includes an adhesive surface configured to stick to the one or more aircraft avionics electrical circuits.

12. A method, comprising:
cooling a heat source using waste heat from an aircraft system and without using a compressor, wherein using waste heat includes using the waste heat to drive an ejector pump to generate flow through a cooling branch to provide cooling flow to one or more cooling modules in thermal communication with the heat source, wherein the one or more cooling modules includes a plurality of cooling modules are disposed in parallel with each other, wherein the plurality of cooling modules are in thermal communication with one or more aircraft electronics.

* * * * *